United States Patent
Jung et al.

(10) Patent No.: US 11,797,038 B2
(45) Date of Patent: Oct. 24, 2023

(54) VOLTAGE REGULATOR AND SEMICONDUCTOR MEMORY DEVICE HAVING THE SAME

(71) Applicant: Samsung Electronics Co., Ltd., Suwon-si (KR)

(72) Inventors: Woochul Jung, Hwaseong-si (KR); Myoungbo Kwak, Seoul (KR); Jaewoo Park, Yongin-si (KR); Eunseok Shin, Seoul (KR); Junhan Choi, Suwon-si (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 97 days.

(21) Appl. No.: 17/577,201

(22) Filed: Jan. 17, 2022

(65) Prior Publication Data
US 2022/0404852 A1     Dec. 22, 2022

(30) Foreign Application Priority Data
Jun. 16, 2021    (KR) ........................ 10-2021-0077765

(51) Int. Cl.
| | |
|---|---|
| *G11C 8/10* | (2006.01) |
| *G05F 1/575* | (2006.01) |
| *G11C 8/18* | (2006.01) |
| *G11C 5/14* | (2006.01) |

(52) U.S. Cl.
CPC .............. *G05F 1/575* (2013.01); *G11C 5/147* (2013.01); *G11C 8/10* (2013.01); *G11C 8/18* (2013.01)

(58) Field of Classification Search
CPC ........... G05F 1/575; G05F 1/56; G11C 5/147; G11C 8/10; G11C 8/18; G11C 7/225
USPC .......................................................... 365/226
See application file for complete search history.

(56) References Cited

U.S. PATENT DOCUMENTS

| | | | |
|---|---|---|---|
| 8,648,580 B2 | 2/2014 | Wong | |
| 8,872,492 B2 | 10/2014 | Zhang et al. | |
| 9,059,698 B2 | 6/2015 | Doo et al. | |
| 9,791,874 B1 | 10/2017 | Wang | |
| 2016/0320782 A1* | 11/2016 | Kato | ....................... H03F 3/345 |

(Continued)

FOREIGN PATENT DOCUMENTS

KR        101010451 B1     1/2011

*Primary Examiner* — Huan Hoang
*Assistant Examiner* — Minh Dinh
(74) *Attorney, Agent, or Firm* — Harness, Dickey & Pierce, P.L.C.

(57) ABSTRACT

A voltage regulator and a semiconductor memory device having the same are disclosed. The voltage regulator includes an amplifier configured to amplify a difference between a reference voltage and a feedback voltage to generate an amplifier output voltage, a voltage feedback unit connected between an output supply voltage generation node and a ground voltage and configured to generate the feedback voltage, a first transfer gate unit connected between an input supply voltage and the voltage generation node and driven in response to the amplifier output voltage to provide first current, a current load replica unit connected between the voltage generation node and the ground voltage and configured to consume the first current, and a transfer unit connected between the input supply voltage and the voltage generation node and driven in response to the amplifier output voltage when the current load unit performs an operation, to provide second current.

28 Claims, 10 Drawing Sheets

(56) References Cited

U.S. PATENT DOCUMENTS

| | | | |
|---|---|---|---|
| 2018/0024581 A1* | 1/2018 | Sabbineni | G05F 1/577 |
| | | | 323/267 |
| 2020/0176978 A1 | 6/2020 | Shen et al. | |
| 2022/0093204 A1* | 3/2022 | Chaudhry | G11C 29/44 |
| 2023/0009027 A1* | 1/2023 | Chen | G05F 1/595 |

* cited by examiner

VOLTAGE REGULATOR AND SEMICONDUCTOR MEMORY DEVICE HAVING THE SAME

CROSS-REFERENCE TO THE RELATED APPLICATION

This application claims priority from Korean Patent Application No. 10-2021-0077765, filed on Jun. 16, 2021, in the Korean Intellectual Property Office, the disclosure of which is incorporated herein by reference in its entirety.

BACKGROUND

1. Field

Example embodiments of the disclosure relate to a voltage regulator and a semiconductor memory device having the same.

2. Description of the Related Art

A voltage regulator may be a circuit which generates an output supply voltage lower than an input supply voltage. A low drop-out (LDO) regulator is a kind of voltage regulator. A general voltage regulator is configured to generate an output supply voltage lower than an input supply voltage by a first predetermined or alternatively, desired voltage (for example, 2V) or more. However, the low drop-out regulator may be configured to generate an output supply voltage lower than an input supply voltage by a second predetermined or alternatively, desired voltage (for example, 0.5V) or less.

SUMMARY

Example embodiments of the disclosure provide a voltage regulator which is capable of stably generating an output supply voltage even if a current load unit abruptly performs an operation, and a semiconductor memory device having the same.

Objects of example embodiments of the disclosure are not limited to the aforementioned object, and other unmentioned objects will be clearly understood by those skilled in the art based on the following description of the disclosure.

A voltage regulator in accordance with example embodiments of the disclosure may include an amplifier configured to amplify a difference between a reference voltage and a feedback voltage to generate an amplifier output voltage, a voltage feedback unit connected between an output supply voltage generation node, the output supply voltage generation node generating an output supply voltage, and a ground voltage and configured to generate the feedback voltage corresponding to the output supply voltage, a first transfer gate unit connected between an input supply voltage and the output supply voltage generation node and driven in response to the amplifier output voltage of a target level to provide first current, a current load replica unit connected between the output supply voltage generation node and the ground voltage and configured to be smaller in size than a current load unit to consume the first current, and a transfer unit connected between the input supply voltage and the output supply voltage generation node and driven in response to the amplifier output voltage of the target level when the current load unit performs an operation, to provide second current larger than the first current.

A voltage regulator in accordance with example embodiments of the disclosure may include an amplifier configured to amplify a difference between a reference voltage and a feedback voltage to generate an amplifier output voltage, a voltage divider connected between an output supply voltage generation node, the output supply voltage generation node generating an output supply voltage, and a ground voltage and configured to divide the output supply voltage to generate the feedback voltage, a first transfer gate unit connected between an input supply voltage and the output supply voltage generation node and driven in response to the amplifier output voltage of a target level to provide first current to the output supply voltage generation node, a current load replica unit connected between the output supply voltage generation node and the ground voltage and configured to be smaller in size than a current load unit to consume the first current, a transfer unit connected between the input supply voltage and the output supply voltage generation node, and, when the current load unit performs an operation in response to an enable signal, turned on in response to the enable signal and driven in response to the amplifier output voltage of the target level to provide second current larger than the first current to the output supply voltage generation node, and an output capacitor connected between the output supply voltage generation node and the ground voltage.

A semiconductor memory device in accordance with example embodiments of the disclosure may include a voltage regulator configured to receive an external supply voltage and generate an internal supply voltage lower than the external supply voltage to an internal supply voltage generation node, a clock signal buffer connected to the internal supply voltage generation node to receive the internal supply voltage and enabled in response to a clock enable signal to buffer an external clock signal to generate an internal clock signal, a command and address generator configured to decode a command and address in response to the external clock signal and the clock enable signal to generate an active command, a read command and a write command, and generate an address signal included in the command and address as a row address in response to the active command and as a column address in response to the read command or write command, a row decoder configured to decode the row address to generate a plurality of word line select signals, a column decoder configured to decode the column address to generate a plurality of column select signals, and a memory cell array including a plurality of memory cells connected between a plurality of word lines selected by the plurality of word line select signals and a plurality of bit lines selected by the plurality of column select signals, wherein the voltage regulator may include an amplifier configured to amplify a difference between a reference voltage and a feedback voltage to generate an amplifier output voltage, a voltage feedback unit connected between the internal supply voltage generation node and a ground voltage and configured to generate the feedback voltage corresponding to the internal supply voltage, a first transfer gate unit connected between the external supply voltage and the internal supply voltage generation node and driven in response to the amplifier output voltage of a target level to provide first current to the internal supply voltage generation node, a clock signal buffer replica unit connected between the internal supply voltage generation node and the ground voltage and configured to be smaller in size than the clock signal buffer to consume the first current, and a transfer unit connected between the external supply voltage and the internal supply voltage generation node and driven in response to the amplifier output voltage of the target level when the clock signal buffer performs an operation in response to the clock enable signal, to provide second current larger than the first current to the internal supply voltage generation node.

DETAILED DESCRIPTION OF EXAMPLE EMBODIMENTS

Hereinafter, a voltage regulator and a semiconductor memory device having the same according to example embodiments of the disclosure will be described with reference to the accompanying drawings.

Figure 1:
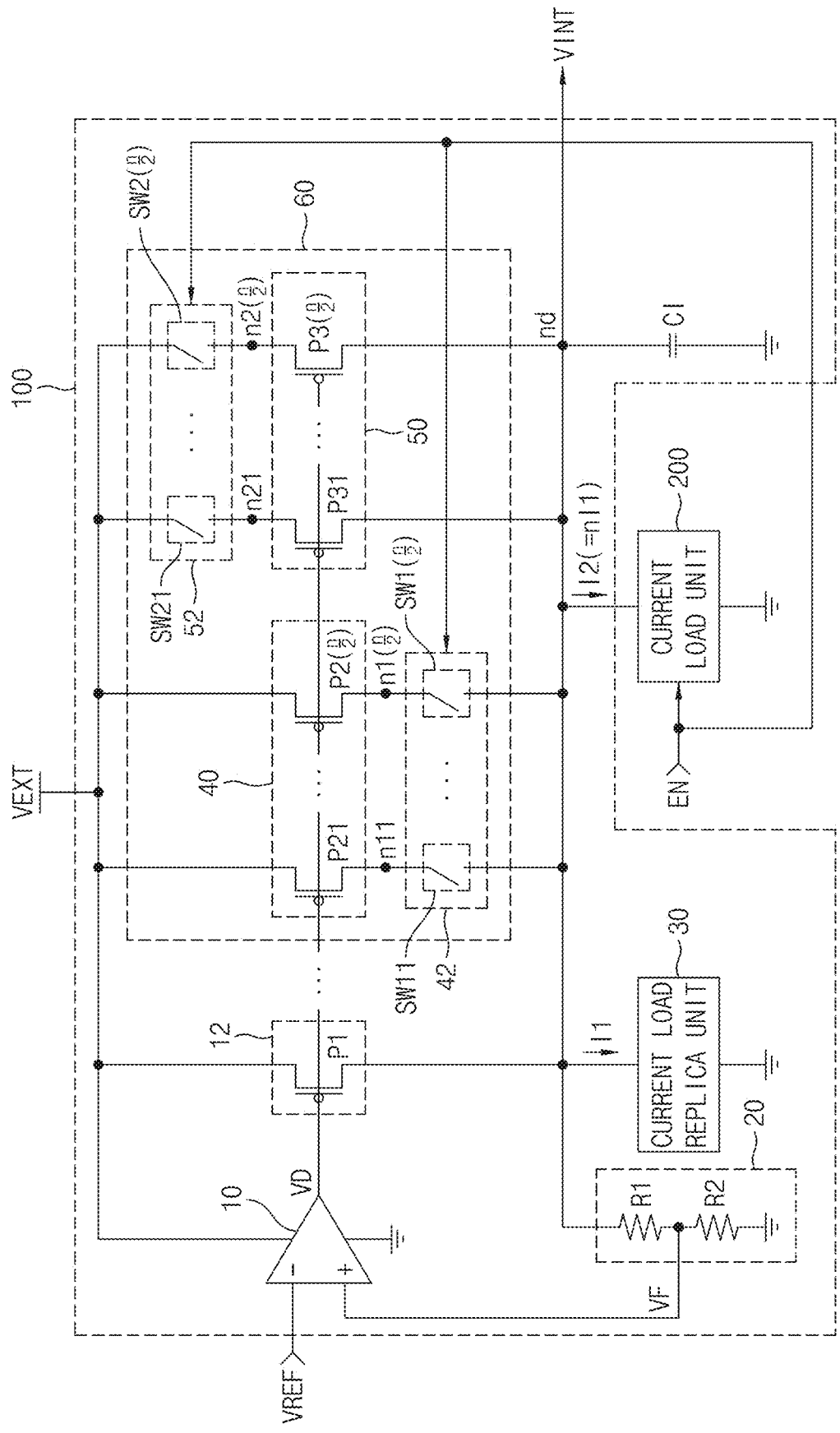
FIG. 1 is a circuit diagram showing the configuration of a voltage regulator according to example embodiments of the disclosure.

FIG. 1 is a circuit diagram showing a configuration of a voltage regulator according to example embodiments of the disclosure. A voltage regulator 100 may include an amplifier 10, a voltage feedback unit 20, a current load replica unit 30, a first transfer gate unit 12, a transfer unit 60, and/or an output capacitor C1. The transfer unit 60 may include a second transfer gate unit 40, a first switching unit 42, a third transfer gate unit 50, and/or a second switching unit 52. A current load unit 200 may be a component which receives an output supply voltage VINT generated from the voltage regulator 100 to perform an operation.

A description will hereinafter be given of each of the components shown in FIG. 1.

The amplifier 10 may amplify a difference between a reference voltage VREF and a feedback voltage VF to generate an amplifier output voltage VD. For example, the amplifier 10 may decrease the level of the amplifier output voltage VD when the feedback voltage VF is lower in level than the reference voltage VREF, and increase the level of the amplifier output voltage VD when the feedback voltage VF is higher in level than the reference voltage VREF.

The voltage feedback unit 20 may generate the feedback voltage VF corresponding to a voltage at an output supply voltage generation node nd. The voltage feedback unit 20 may be a voltage divider including a first resistor R1 and a second resistor R2 connected in series between the output supply voltage generation node nd and a ground voltage. The voltage divider may divide the voltage at the output supply voltage generation node nd to generate the feedback voltage VF.

The first transfer gate unit 12 may be connected between an input supply voltage VEXT and the output supply voltage generation node nd and be driven in response to the amplifier output voltage VD to provide current to the output supply voltage generation node nd. For example, where the current load replica unit 30 is configured to consume first current I1, the first transfer gate unit 12 may be driven in response to the amplifier output voltage VD of a target level to provide a first current I1 to the output supply voltage generation node nd. The first transfer gate unit 12 may be a first PMOS transistor P1. The first transfer gate unit 12 may increase the first current I1 to be provided to the output supply voltage generation node nd when the amplifier output voltage VD of the target level is decreased, and decrease the first current I1 to be provided to the output supply voltage generation node nd when the amplifier output voltage VD of the target level is increased.

The current load replica unit 30 may be configured to be smaller in size than the current load unit 200 by replicating the current load unit 200 connected between the output supply voltage generation node nd and the ground voltage. For example, transistors constituting the current load replica unit 30 may be smaller in size than transistors constituting the current load unit 200 by a predetermined or alternatively, desired multiple (for example, n times, where n may be an integer).

The current load unit 200 may be a component which is connected between the output supply voltage generation node nd and the ground voltage and receives the output supply voltage VINT to perform an operation, and may perform an operation in response to an enable signal EN. For example, where the current load unit 200 is configured to consume a second current I2 when performing an operation in response to the enable signal EN, the current load replica unit 30 may be configured to consume the first current I1 smaller than the second current I2 by a predetermined or alternatively, desired multiple (for example, n times).

The second transfer gate unit 40 may include n/2 second PMOS transistors P21 to P2($n/2$) connected in parallel between the input supply voltage VEXT and n/2 first nodes n11 to n1($n/2$). The n/2 second PMOS transistors P21 to P2($n/2$) may be driven in response to the amplifier output voltage VD to provide the second current I2/2 to the output supply voltage generation node nd. For example, each of the n/2 second PMOS transistors P21 to P2($n/2$) may have the same size as that of the first PMOS transistor P1, and the n/2 second PMOS transistors P21 to P2($n/2$) may provide the second current I2/2 to the output supply voltage generation node nd in response to the amplifier output voltage VD of the target level. The n/2 second PMOS transistors P21 to P2($n/2$) may increase (n/2)×first current I1, namely, the second current I2/2, to be provided to the output supply voltage generation node nd when the amplifier output voltage VD of the target level is decreased, and decrease (n/2)×the first current I1, namely, the second current I2/2, to be provided to the output supply voltage generation node nd when the amplifier output voltage VD of the target level is increased.

The third transfer gate unit 50 may include n/2 third PMOS transistors P31 to P3($n/2$) connected in parallel between n/2 second nodes n21 to n2($n/2$) and the output supply voltage generation node nd. The n/2 third PMOS transistors P31 to P3(n/2) may be driven in response to the amplifier output voltage VD to provide the second current I2/2 to the output supply voltage generation node nd. For example, each of the n/2 third PMOS transistors P31 to P3(n/2) may have the same size as that of the first PMOS transistor P1, and the n/2 third PMOS transistors P31 to P3(n/2) may provide second current I2/2 to the output supply voltage generation node nd in response to the amplifier output voltage VD of the target level. The n/2 third PMOS transistors P31 to P3(n/2) may increase (n/2)×the first current I1, namely, the second current I2/2, to be provided to the output supply voltage generation node nd when the amplifier output voltage VD of the target level is decreased, and decrease (n/2)×the first current I1, namely, the second current I2/2, to be provided to the output supply voltage generation node nd when the amplifier output voltage VD of the target level is increased.

The first switching unit 42 may include n/2 first switches SW11 to SW1(n/2) connected in parallel between the n/2 first nodes n11 to n1(n/2) and the output supply voltage generation node nd. The n/2 first switches SW11 to SW1(n/2) may be n/2 fourth PMOS transistors. The n/2 first switches SW11 to SW1(n/2) may be turned on in response to the enable signal EN.

The second switching unit 52 may include n/2 second switches SW21 to SW2(n/2) connected in parallel between the input supply voltage VEXT and the n/2 second nodes n21 to n2(n/2). The n/2 second switches SW21 to SW2(n/2) may be n/2 fifth PMOS transistors. The n/2 second switches SW21 to SW2(n/2) may be turned on in response to the enable signal EN.

By virtue of the connection of the first switching unit 42 between the first nodes n11 to n1(n/2) and the output supply voltage generation node nd and the connection of the second switching unit 52 between the input supply voltage VEXT and the second nodes n21 to n2(n/2), decrease of the amplifier output voltage VD resulting from an AC coupling capacitance which may be generated between a gate and a drain of each of the second PMOS transistors P21 to P2(n/2) when each of the second PMOS transistors P21 to P2(n/2) is turned on and increase of the amplifier output voltage VD resulting from an AC coupling capacitance which may be generated between the gate and source of each of the third PMOS transistors P31 to P3(n/2) when each of the third PMOS transistors P31 to P3(n/2) is turned on may be offset and thus may not affect the amplifier output voltage VD.

In some example embodiments where the current load unit 200 is configured to consume the second current I2 when performing an operation in response to the enable signal EN, the transfer unit 60 may be turned on in response to the enable signal EN and be driven in response to the amplifier output voltage VD of the target level to provide the second current I2 to the output supply voltage generation node nd. That is, the transfer unit 60 may provide the second current I2 larger by a predetermined or alternatively, desired multiple (for example, n times) than the first current I1 which is provided to the output supply voltage generation node nd as the first transfer gate unit 12 is driven in response to the amplifier output voltage VD of the target level.

The output capacitor C1 may be connected between the output supply voltage generation node nd and the ground voltage. The output capacitor C1 may allow current to be transferred to the current load unit 200 when a transient current change at the output supply voltage generation node nd by the current load unit 200 occurs. The output capacitor C1 may not be employed.

In a different manner from those shown in FIG. 1, the second transfer gate unit 40 may be configured to include one second PMOS transistor of a larger size, namely, an n/2 times size, the third transfer gate unit 50 may be configured to included one third PMOS transistor of a larger size, namely, an n/2 times size, the first switching unit 42 may be configured to include one first switch, and the second switching unit 52 may be configured to included one second switch.

Figure 2A:
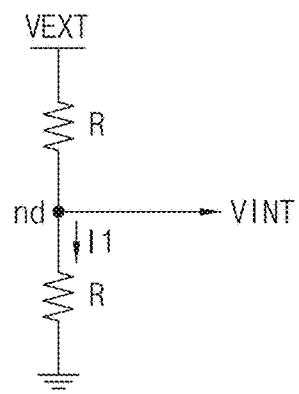
FIGS. 2A and 2B are equivalent circuit diagrams of the voltage regulator shown in FIG. 1.

FIG. 2A is an equivalent circuit diagram of the voltage regulator shown in FIG. 1, which shows a modeled configuration of the voltage regulator 100 when the operation of the current load unit 200 is disabled in response to the enable signal EN and the first switching unit 42 and the second switching unit 52 are both turned off in response to the enable signal EN.

Referring to FIG. 2A, when the amplifier output voltage VD of the target level is applied to the first transfer gate unit 12 and the first current I1 is consumed through the current load replica unit 30, the first PMOS transistor P1 of the first transfer gate unit 12 may be depicted as a resistor R, and the current load replica unit 30 may be depicted as a resistor R. In some example embodiments, the first current I1 may be expressed as VEXT/2R, and the output supply voltage VINT may be expressed as VEXT/2.

Figure 2B:
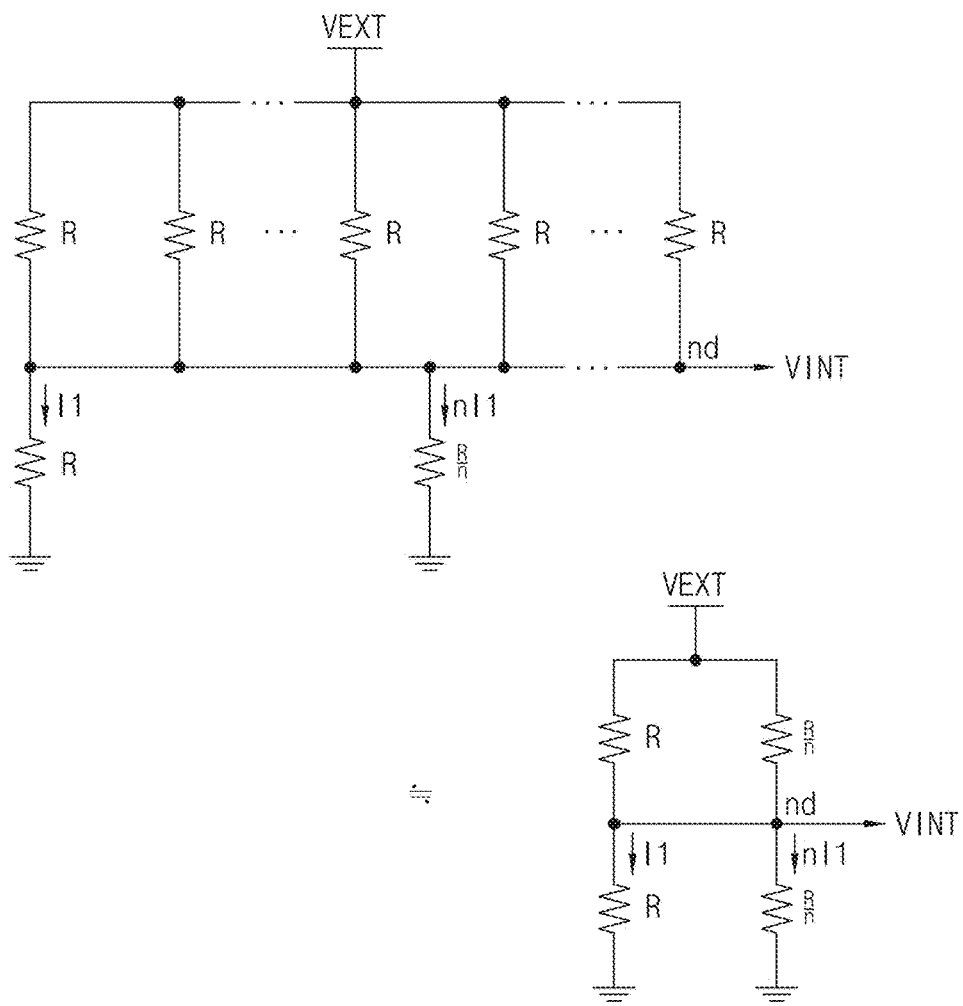

FIG. 2B is an equivalent circuit diagram of the voltage regulator shown in FIG. 1, which shows a modeled configuration of the voltage regulator 100 when the operation of the current load unit 200 is enabled in response to the enable signal EN and the first switching unit 42 and the second switching unit 52 are both turned on in response to the enable signal EN. In addition, the equivalent circuit diagram of FIG. 2B shows a modeled configuration of the voltage regulator 100 when the second transfer gate unit 40 is configured to include the n/2 second PMOS transistors P21 to P2(n/2), the third transfer gate unit 50 is configured to include the n/2 third PMOS transistors P31 to P3(n/2), and the first PMOS transistor P1, each of the n/2 second PMOS transistors P21 to P2(n/2) and each of the n/2 third PMOS transistors P31 to P3(n/2) are the same in size.

Referring to FIG. 2B, when the amplifier output voltage VD of the target level is applied to the first transfer gate unit 12, the second transfer gate unit 40 and the third transfer gate unit 50, the first current I1 is consumed through the current load replica unit 30 and the second current I2 (for example, n×I1 (=nI1)) is consumed through the current load unit 200, the first PMOS transistor P1 of the first transfer gate unit 12 may be depicted as a resistor R, each of the n/2 second PMOS transistors P21 to P2(n/2) and the n/2 third PMOS transistors P31 to P3(n/2) may be depicted as a resistor R, and the current load unit 200 may be depicted as a resistor R/n. In some example embodiments, the second current I2 may be expressed as n×(VEXT/2R), and the output supply voltage VINT may be expressed as VEXT/2.

Referring to FIGS. 2A and 2B, in the voltage regulator 100 according to the present example embodiments, the output supply voltage VINT when the current load unit 200 does not operate and the output supply voltage VINT when the current load unit 200 operates in response to the enable signal EN may be the same, namely, VEXT/2. That is, even if the current load unit 200 abruptly performs an operation in response to the enable signal EN, the amplifier output voltage VD may maintain the target level and the transfer unit 60 may provide the second current I2 in response to the amplifier output voltage VD of the target level, so that the voltage at the output supply voltage generation node nd, namely, the output supply voltage VINT, may not be decreased in level.

Figure 3:
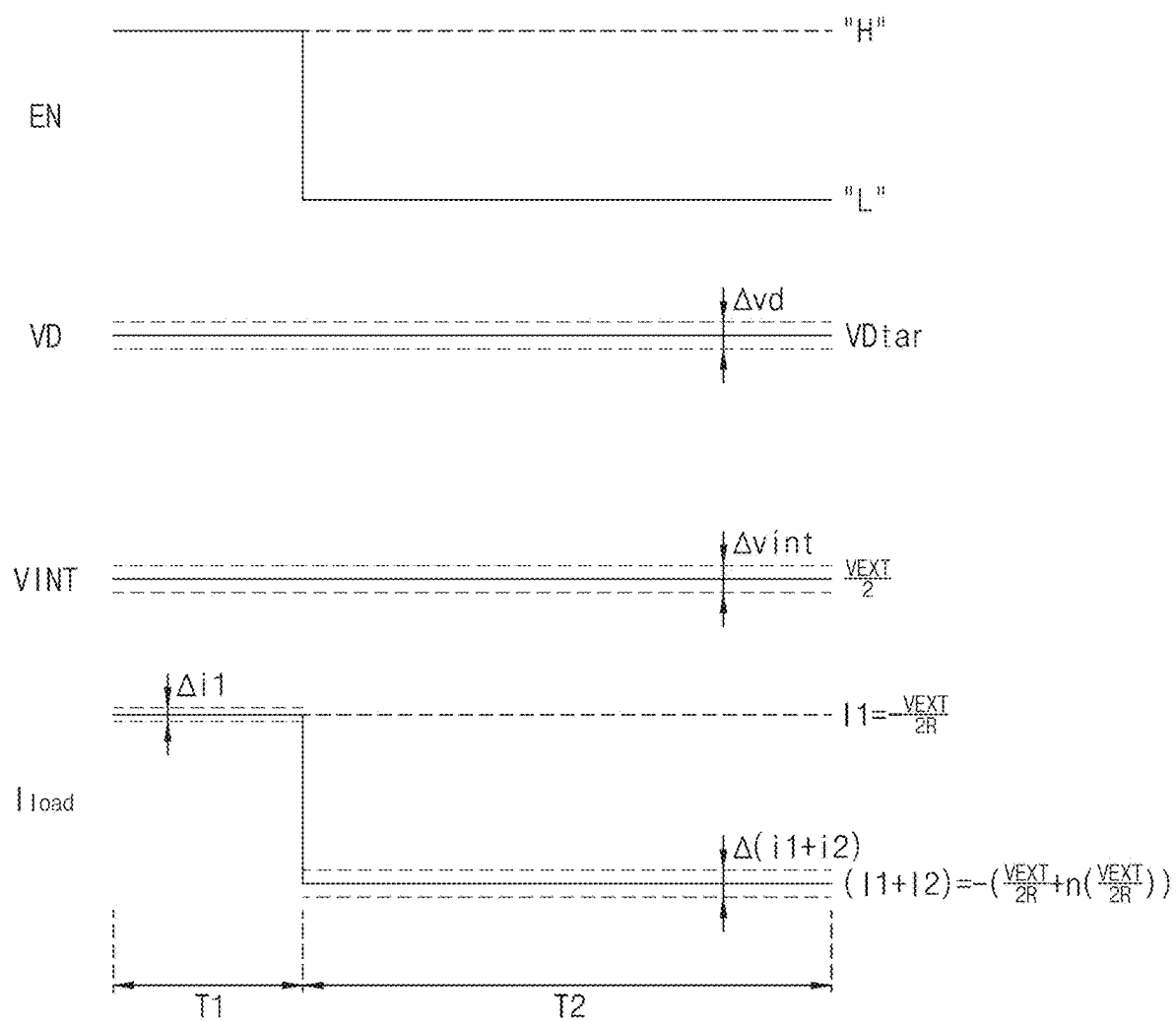
FIG. 3 is a view illustrating an operation of the voltage regulator based on an enable signal according to example embodiments.

FIG. 3 is a view illustrating an operation of the voltage regulator based on the enable signal EN according to example embodiments.

Referring to FIGS. 2A and 3, in a period T1 in which the enable signal EN is "high" in level, a load current Iload consumed through the current load replica unit 30 may be the first current I1, the amplifier output voltage VD may have the target level VDtar, the output supply voltage VINT may be VEXT/2, and the first current I1 may be expressed as −VEXT/2R. In this period T1, the first current I1 may be increased or decreased within a current range Δi1, the output supply voltage VINT may also be increased or decreased within a voltage range Δvint, and the amplifier output voltage VD may also be increased or decreased within a voltage range Δvd. The voltage regulator 100 may operate in such a manner that, when the load current Iload is increased, the feedback voltage VF is decreased to decrease the target level VDtar, and when the load current Iload is decreased, the feedback voltage VF is increased to increase the target level VDtar, thereby maintaining the output supply voltage VINT at VEXT/2.

Referring to FIGS. 2B and 3, in a period T2 in which the enable signal EN is "low" in level, the load current Iload may be I1+I2 because the first current I1 is consumed through the current load replica unit 30 and the second current I2 is consumed through the current load unit 200, the amplifier output voltage VD may have the target level VDtar, the output supply voltage VINT may be VEXT/2, and the load current Iload may be expressed as −(VEXT/2R+n(VEXT/2R)). In this period T2, the load current Iload may be increased or decreased within a predetermined or alternatively, desired current range Δi1+Δi2, and the output supply voltage VINT and the amplifier output voltage VD may be increased or decreased within the same or similar ranges as or to those in the period T1. The voltage regulator 100 may operate in such a manner that, when the load current Iload is increased, the feedback voltage VF is decreased to decrease the target level VDtar, and when the load current Iload is decreased, the feedback voltage VF is increased to increase the target level VDtar, thereby maintaining the output supply voltage VINT at VEXT/2. That is, in the period T2, even if the load current Iload is abruptly increased to a current I1+I2, the output supply voltage VINT and the amplifier output voltage VD which are almost the same as those in the period T1 may be maintained.

Figure 4:
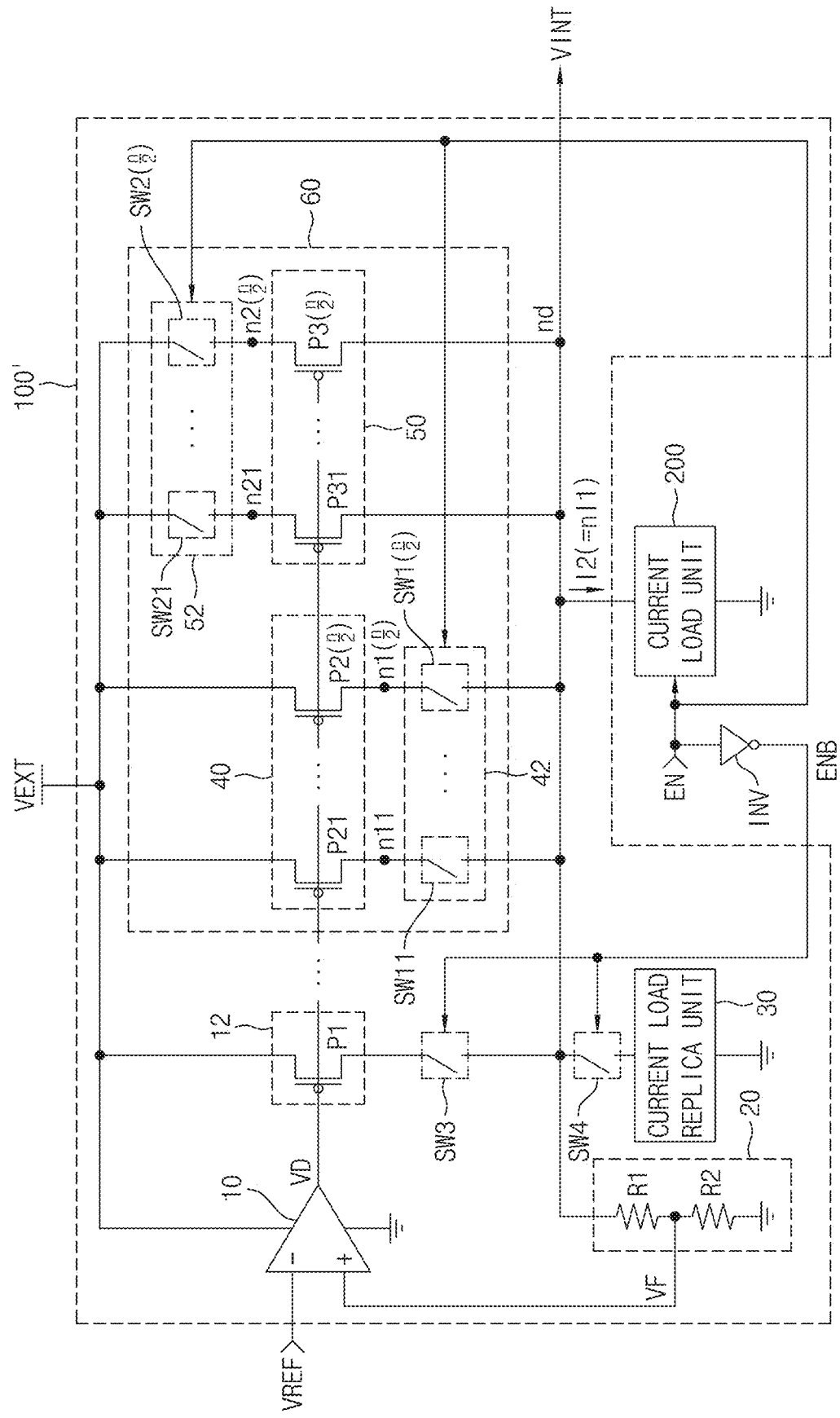
FIG. 4 is a circuit diagram showing the configuration of a voltage regulator according to example embodiments of the disclosure.

FIG. 4 is a circuit diagram showing a configuration of a voltage regulator according to example embodiments of the disclosure. A voltage regulator 100' shown in FIG. 4 may further include a third switch SW3 and a fourth switch SW4 in addition to the configuration of the voltage regulator 100 shown in FIG. 1. In addition, the voltage regulator 100' may further include an inverter INV outside thereof.

A description will hereinafter be given of the function of each of the additional ones of the components shown in FIG. 4.

The third switch SW3 may be connected between the first transfer gate unit 12 and the output supply voltage generation node nd and be turned on in response to an inverted enable signal ENB. For example, the third switch SW3 may be a sixth PMOS transistor which is connected between a drain of the first PMOS transistor P1 and the output supply voltage generation node nd and is turned on in response to the inverted enable signal ENB.

The fourth switch SW4 may be connected between the output supply voltage generation node nd and the current load replica unit 30 and be turned on in response to the inverted enable signal ENB. For example, the fourth switch SW4 may be a seventh PMOS transistor which is connected between the output supply voltage generation node nd and the current load replica unit 30 and is turned on in response to the inverted enable signal ENB.

The inverter INV may invert the enable signal EN to generate the inverted enable signal ENB.

Referring to FIG. 4, when the operation of the current load unit 200 is disabled in response to the enable signal EN, the first switching unit 42 and the second switching unit 52 are turned off in response to the enable signal EN and the third switch SW3 and the fourth switch SW4 are turned on in response to the enable signal EN, a modeled configuration of the voltage regulator 100' may be the same as that of FIG. 2A. In addition, in some example embodiments, the amplifier output voltage VD, the output supply voltage VINT and the load current Iload may be the same as those in the period T1 of FIG. 3.

Figure 5:
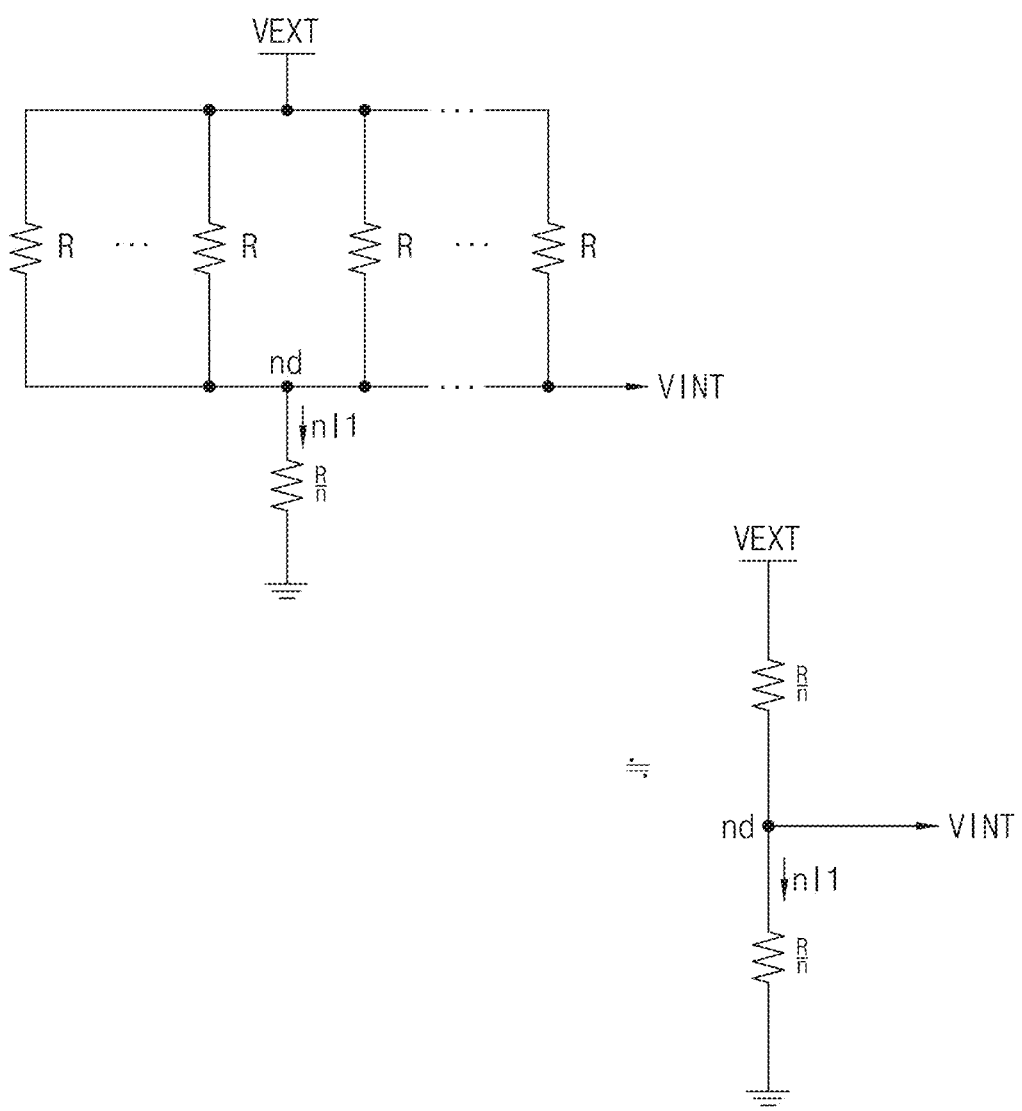
FIG. 5 is an equivalent circuit diagram of the voltage regulator shown in FIG. 4.

FIG. 5 is an equivalent circuit diagram of the voltage regulator shown in FIG. 4, which shows a modeled configuration of the voltage regulator 100' when the operation of the current load unit 200 is enabled in response to the enable signal EN, the first switching unit 42 and the second switching unit 52 are both turned on in response to the enable signal EN and the third switch SW3 and the fourth switch SW4 are both turned off in response to the enable signal EN. In addition, the equivalent circuit diagram of FIG. 5 shows a modeled configuration of the voltage regulator 100' when the second transfer gate unit 40 is configured to include the n/2 second PMOS transistors P21 to P2(n/2), the third transfer gate unit 50 is configured to include the n/2 third PMOS transistors P31 to P3(n/2), and the first PMOS transistor P1, each of the n/2 second PMOS transistors P21 to P2(n/2) and each of the n/2 third PMOS transistors P31 to P3(n/2) are the same in size.

Referring to FIG. 5, when the amplifier output voltage VD of the target level is applied to the first transfer gate unit 12, the second transfer gate unit 40 and the third transfer gate unit 50 and the second current I2 (for example, n×I1) is consumed through the current load unit 200, each of the n/2 second PMOS transistors P21 to P2(n/2) and the n/2 third PMOS transistors P31 to P3(n/2) may be depicted as a resistor R, and the current load unit 200 may be depicted as a resistor R/n. In some example embodiments, the second current I2 may be expressed as n×(VEXT/2R), and the output supply voltage VINT may be expressed as VEXT/2.

Referring to FIGS. 2A and 5, in the voltage regulator 100' according to the present example embodiments, the output supply voltage VINT when the current load unit 200 does not operate and the output supply voltage VINT when the current load unit 200 operates in response to the enable signal EN may be the same, namely, VEXT/2. That is, even if the current load unit 200 abruptly performs an operation in response to the enable signal EN, the amplifier output voltage VD may maintain the target level and the transfer unit 60 may provide the second current I2 in response to the amplifier output voltage VD of the target level, so that the voltage at the output supply voltage generation node nd, namely, the output supply voltage VINT, may not be decreased in level.

Figure 6:
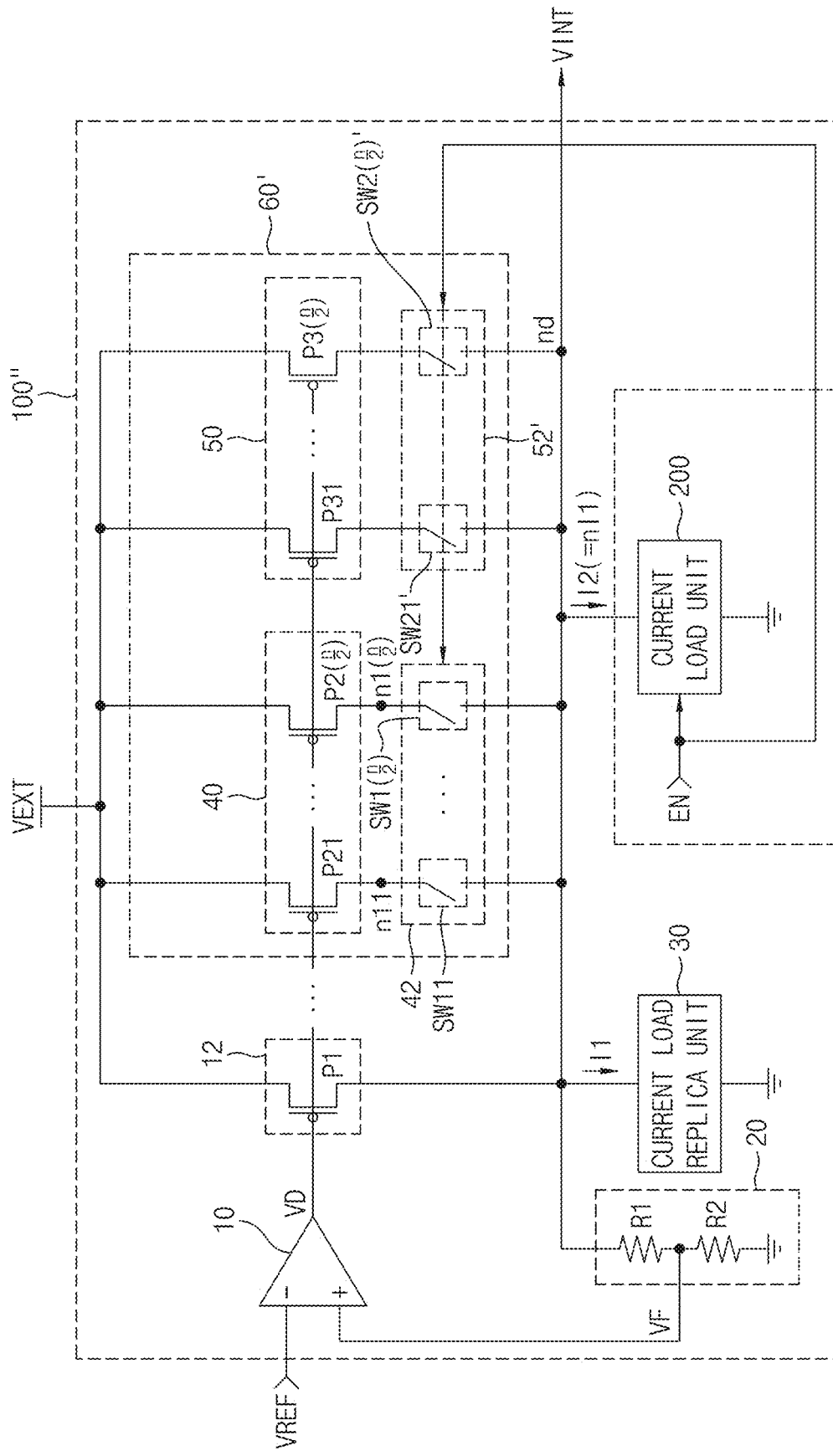
FIG. 6 is a circuit diagram showing the configuration of a voltage regulator according to example embodiments of the disclosure.

FIG. 6 is a circuit diagram showing a configuration of a voltage regulator according to example embodiments of the disclosure. A voltage regulator 100" may have the same configuration as in FIG. 1, with the exception that a transfer unit 60' includes a second switching unit 52' connected between the third transfer gate unit 50 and the output supply voltage generation node nd instead of the second switching unit 52 of the transfer unit 60 of the voltage regulator 100 shown in FIG. 1.

Referring to FIG. 6, the second switching unit 52' may include n/2 second switches SW21' to SW2(n/2)' connected in parallel between drains of the n/2 third PMOS transistors P31 to P3(n/2) of the third transfer gate unit 50 and the output supply voltage generation node nd. The n/2 second switches SW21' to SW2(n/2)' may be n/2 fifth PMOS transistors. The n/2 second switches SW21' to SW2(n/2)' may be turned on in response to the enable signal EN.

The description of the voltage regulator 100'' shown in FIG. 6 will be easily understood with reference to the above description of FIGS. 1 to 5.

Although not shown, as an embodiment, a voltage regulator may include a first switching unit connected between the input supply voltage VEXT and the second transfer gate unit 40 instead of the first switching unit 42 of the voltage regulator 100 shown in FIG. 1.

Figure 7:
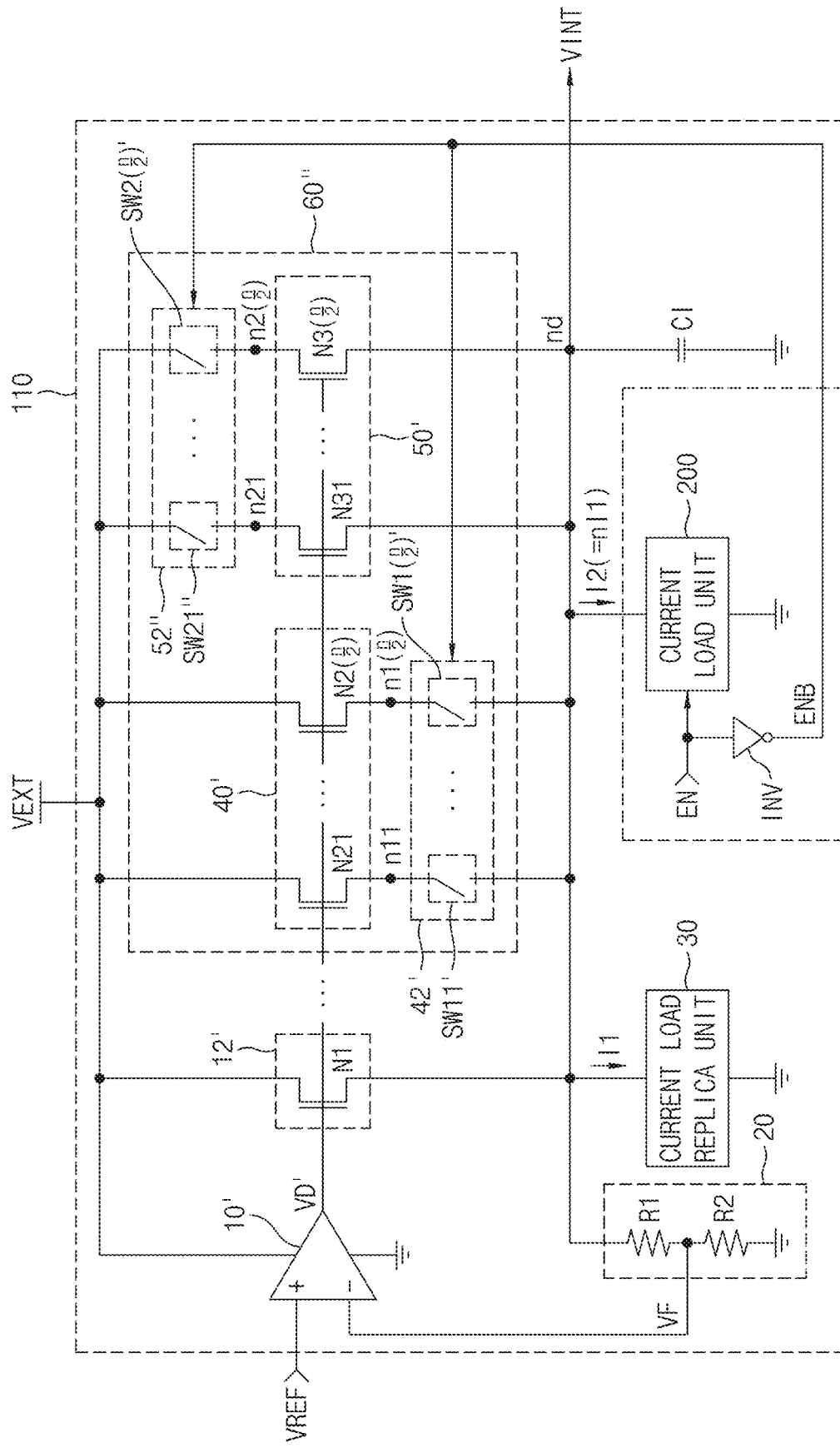
FIG. 7 is a circuit diagram showing the configuration of a voltage regulator according to example embodiments of the disclosure.

FIG. 7 is a circuit diagram showing a configuration of a voltage regulator according to example embodiments of the disclosure. A voltage regulator 110 may include an amplifier 10', a first transfer gate unit 12', a voltage feedback unit 20, a current load replica unit 30, a transfer unit 60'', and/or an output capacitor C1. The transfer unit 60'' may include a second transfer gate unit 40', a first switching unit 42', a third transfer gate unit 50', and/or a second switching unit 52''. A current load unit 200 may be a component which receives an output supply voltage VINT generated from the voltage regulator 110 to perform an operation, and an inverter INV may be a component which generates an inverted enable signal ENB.

The voltage feedback unit 20, the current load replica unit 30, the current load unit 200 and the output capacitor C1 among the components shown in FIG. 7 have been described with reference to FIG. 1, and each of the other components will hereinafter be described.

The amplifier 10' may amplify a difference between a reference voltage VREF and a feedback voltage VF to generate an amplifier output voltage VD'. For example, the amplifier 10' may increase the level of the amplifier output voltage VD' when the feedback voltage VF is lower in level than the reference voltage VREF, and decrease the level of the amplifier output voltage VD' when the feedback voltage VF is higher in level than the reference voltage VREF.

The first transfer gate unit 12' may be connected between an input supply voltage VEXT and the output supply voltage generation node nd and be driven in response to the amplifier output voltage VD'. The first transfer gate unit 12' may provide a first current I1 to the output supply voltage generation node nd in response to the amplifier output voltage VD' of a target level. The first transfer gate unit 12' may be a first NMOS transistor N1. The first transfer gate unit 12' may decrease the first current I1 to be provided to the output supply voltage generation node nd when the amplifier output voltage VD' of the target level is decreased in level, and increase the first current I1 to be provided to the output supply voltage generation node nd when the amplifier output voltage VD' of the target level is increased in level.

The second transfer gate unit 40' may include n/2 second NMOS transistors N21 to N2(n/2) connected in parallel between the input supply voltage VEXT and n/2 first nodes n11 to n1(n/2). The n/2 second NMOS transistors N21 to N2(n/2) may be driven in response to the amplifier output voltage VD' of the target level to provide a second current I2/2 to the output supply voltage generation node nd. For example, each of the n/2 second NMOS transistors N21 to N2(n/2) may have the same size as that of the first NMOS transistor N1, and the n/2 second NMOS transistors N21 to N2(n/2) may be driven in response to the amplifier output voltage VD' of the target level to provide (n/2)×first current I1 to the output supply voltage generation node nd. The n/2 second NMOS transistors N21 to N2(n/2) may decrease (n/2)×first current I1, namely, second current I2/2, to be provided to the output supply voltage generation node nd when the amplifier output voltage VD' of the target level is decreased in level, and increase (n/2)×first current I1, namely, second current I2/2, to be provided to the output supply voltage generation node nd when the amplifier output voltage VD' of the target level is increased in level.

The third transfer gate unit 50' may include n/2 third NMOS transistors N31 to N3(n/2) connected in parallel between n/2 second nodes n21 to n2(n/2) and the output supply voltage generation node nd. The n/2 third NMOS transistors N31 to N3(n/2) may be driven in response to the amplifier output voltage VD' to provide the second current I2/2 to the output supply voltage generation node nd. For example, each of the n/2 third NMOS transistors N31 to N3(n/2) may have the same size as that of the first NMOS transistor N1, and the n/2 third NMOS transistors N31 to N3(n/2) may be driven in response to the amplifier output voltage VD' of the target level to provide (n/2)×the first current I1 to the output supply voltage generation node nd. The n/2 third NMOS transistors N31 to N3(n/2) may decrease (n/2)×the first current I1, namely, the second current I2/2, to be provided to the output supply voltage generation node nd when the amplifier output voltage VD' of the target level is decreased in level, and increase (n/2)×the first current I1, namely, the second current I2/2, to be provided to the output supply voltage generation node nd when the amplifier output voltage VD' of the target level is increased in level.

The first switching unit 42' may include n/2 first switches SW11' to SW1(n/2)' connected in parallel between the n/2 first nodes n11 to n1(n/2) and the output supply voltage generation node nd. The n/2 first switches SW11' to SW1(n/2)' may be n/2 fourth NMOS transistors. The n/2 first switches SW11' to SW1(n/2)' may be turned on in response to the inverted enable signal ENB. The inverted enable signal ENB may be generated by inverting the enable signal EN by the inverter INV.

The second switching unit 52'' may include n/2 second switches SW21'' to SW2(n/2)'' connected in parallel between the input supply voltage VEXT and the n/2 second nodes n21 to n2(n/2). The n/2 second switches SW21'' to SW2(n/2)'' may be n/2 fifth NMOS transistors. The n/2 second switches SW21'' to SW2(n/2)'' may be turned on in response to the inverted enable signal ENB.

By virtue of the connection of the first switching unit 42' between the first nodes n11 to n1(n/2) and the output supply voltage generation node nd and the connection of the second switching unit 52'' between the input supply voltage VEXT and the second nodes n21 to n2(n/2), decrease of the amplifier output voltage VD' resulting from AC coupling capacitance which may be generated between the gate and source of each of the second NMOS transistors N21 to N2(n/2) when each of the second NMOS transistors N21 to N2(n/2) is turned on and increase of the amplifier output voltage VD' resulting from AC coupling capacitance which may be generated between a gate and a drain of each of the third NMOS transistors N31 to N3(n/2) when each of the third NMOS transistors N31 to N3(*n*/2) is turned on may be offset and thus may not affect the amplifier output voltage VD'.

In some example embodiments where the current load unit 200 is configured to consume the second current I2 when performing an operation in response to the enable signal EN, the transfer unit 60" may be turned on in response to the inverted enable signal ENB and be driven in response to the amplifier output voltage VD' of the target level to provide the second current I2 to the output supply voltage generation node nd. That is, the transfer unit 60" may provide the second current I2 larger than the first current I1, which is provided to the output supply voltage generation node nd as the first transfer gate unit 12' is driven in response to the amplifier output voltage VD' of the target level, by a predetermined or alternatively, desired multiple (for example, n times).

The voltage regulator 110 shown in FIG. 7 may be modified and configured as if the voltage regulator 100 shown in FIG. 1 is modified to the voltage regulators 100' and 100" shown in FIGS. 4 and 6. For example, a voltage regulator may be configured by adding a third switch SW3 between the first transfer gate unit 12' and the output supply voltage generation node nd and a fourth switch SW4 between the output supply voltage generation node nd and the current load replica unit 30 to the configuration of the voltage regulator 110 shown in FIG. 7. Each of the third switch SW3 and the fourth switch SW4 may be an NMOS transistor. The NMOS transistors of the third switch SW3 and the fourth switch SW4 may be turned off in response to the inverted enable signal ENB. For another example, a voltage regulator may be configured by connecting the second switching unit 52" of the voltage regulator 110 shown in FIG. 7 between the third transfer gate unit 50' and the output supply voltage generation node nd, not between the input supply voltage VEXT and the third transfer gate unit 50'.

Figure 8:
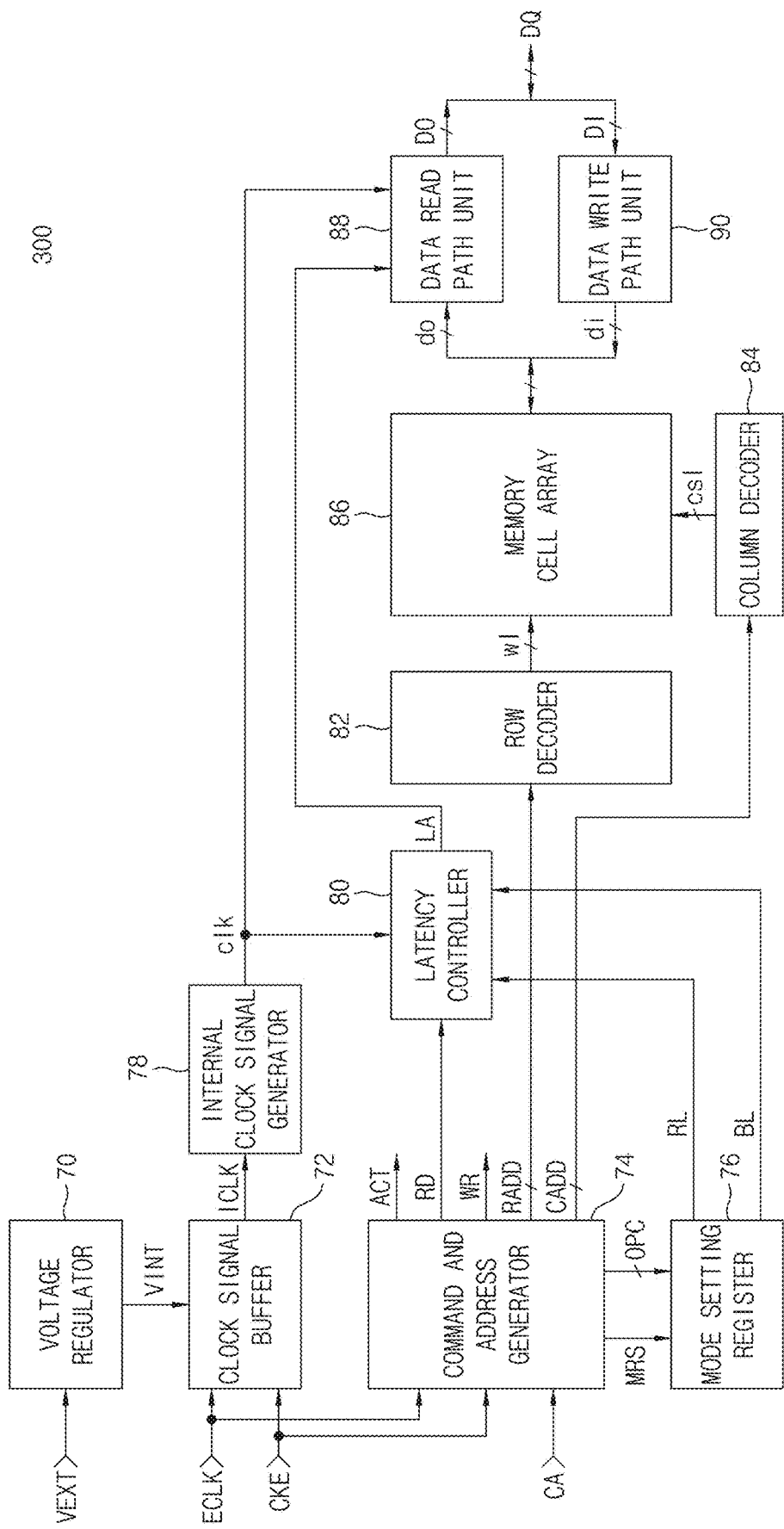
FIG. 8 is a block diagram showing the configuration of a semiconductor memory device according to example embodiments of the disclosure.

FIG. 8 is a block diagram showing the configuration of a semiconductor memory device according to example embodiments of the disclosure. A semiconductor memory device 300 may include a voltage regulator 70, a clock signal buffer 72, a command and address generator 74, a mode setting register 76, an internal clock signal generator 78, a latency controller 80, a row decoder 82, a column decoder 84, a memory cell array 86, a data read path unit 88, and/or a data write path unit 90.

The function of each of the blocks shown in FIG. 8 will hereinafter be described.

The voltage regulator 70 may receive an external supply voltage VEXT and a reference voltage VREF to generate an internal supply voltage VINT lower than the external supply voltage VEXT. The reference voltage VREF may be generated from an internal reference voltage generator (not shown) or be externally applied. The voltage regulator 70 may be any one of the voltage regulators 100, 100', 100" and 110 stated above with reference to FIGS. 1 to 7. The voltage regulator 70 may include, as the current load replica unit 30, a clock signal buffer replica unit configured to be smaller in size than the clock signal buffer 72 by replicating the clock signal buffer 72.

The clock signal buffer 72 may receive the internal supply voltage VINT in response to a clock enable signal CKE to perform an operation. The clock signal buffer 72 may be enabled in response to the clock enable signal CKE to buffer an external clock signal ECLK to generate an internal clock signal ICLK. The clock signal buffer 72 may be the current load unit 200 described with reference to FIGS. 1 to 7, and the clock enable signal CKE may be the enable signal EN described with reference to FIGS. 1 to 7.

The command and address generator 74 may decode a command and address CA in response to the external clock signal ECLK and the clock enable signal CKE to generate a mode setting command MRS, an active command ACT, a read command RD and a write command WR. In addition, the command and address generator 74 may generate an address signal included in the command and address CA as a mode setting code OPC in response to the mode setting command MRS, as a row address RADD in response to the active command ACT, and as a column address CADD in response to the read command RD or the write command WR.

The mode setting register 76 may store the mode setting code OPC in response to the mode setting command MRS to set a read latency RL and a burst length BL.

The internal clock signal generator 78 may generate an internal clock signal clk synchronized with the internal clock signal ICLK. For example, the internal clock signal generator 78 may be a delay locked loop.

The latency controller 80, when the read command RD is generated, may generate, using the internal clock signal clk, a latency signal LA which is activated after being delayed by the number of clock cycles corresponding to the value of the read latency RL and deactivated after being delayed by the number of clock cycles corresponding to the value of the read latency RL+the number of clock cycles corresponding to the value of the burst length BL.

The row decoder 82 may decode the row address RADD to generate a plurality of word line select signals wl.

The column decoder 84 may decode the column address CADD to generate a plurality of column select signals cs1.

The memory cell array 86 may include a plurality of memory cells (not shown) connected between a plurality of word lines selected by the plurality of word line select signals wl and a plurality of bit lines selected by the plurality of column select signals cs1. The memory cell array 86 may output read data do from memory cells selected by the plurality of word line select signals wl and the plurality of column select signals cs1 in response to the read command RD and input write data di to memory cells selected by the plurality of word line select signals wl and the plurality of column select signals cs1 in response to the write command WR.

The data read path unit 88 may receive read data do output from the memory cell array 86 and output output data DO in response to the internal clock signal clk for an active period of the latency signal LA. For example, the data read router 88 may receive xy-bit read data do and serially generate each of x output data DO sequentially by y corresponding to the value of the burst length BL.

The data write path unit 90 may receive input data DI and output write data di to the memory cell array 86. The data write path unit 90 may receive x input data DI serially received sequentially by y corresponding to the value of the burst length BL and generate xy-bit write data di.

Figure 9:
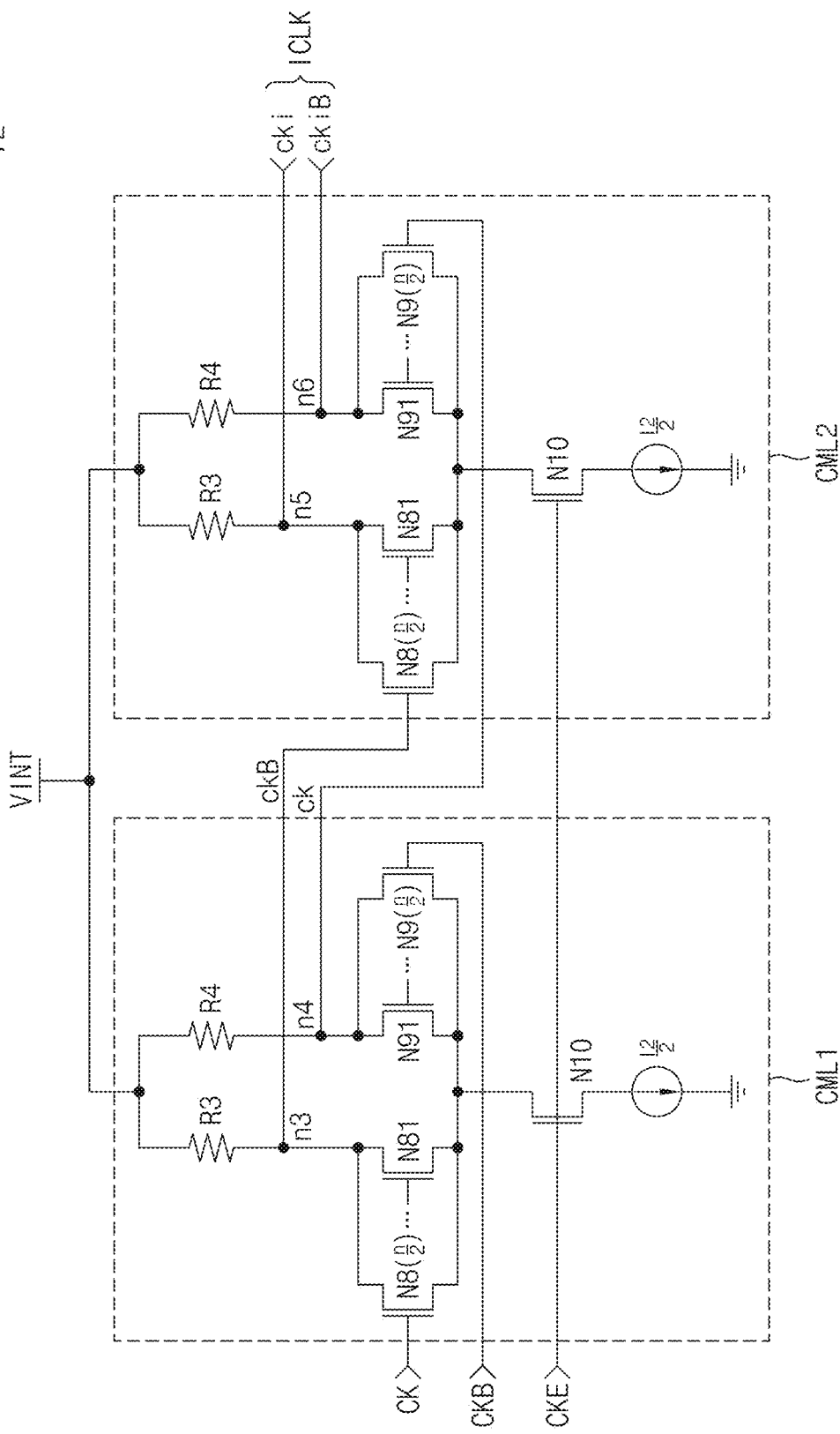
FIG. 9 is a circuit diagram of a clock signal buffer according to example embodiments of the disclosure.

FIG. 9 is a circuit diagram of a clock signal buffer according to example embodiments of the disclosure. The clock signal buffer 72 may include two, first and second current mode logic buffers CML1 and CML2 connected in cascade. Each of the first and second current mode logic buffers CML1 and CML2 may include third and fourth resistors R3 and R4, n/2 eighth NMOS transistors N81 to N8(*n*/2), n/2 ninth NMOS transistors N91 to N9(*n*/2), a tenth NMOS transistor N10, and/or a constant current source I2/2. FIG. 9 shows a configuration of the clock signal buffer 72 in example embodiments where a differential clock signal pair CK and CKB are applied from the outside of the semiconductor memory device 300 shown in FIG. 8.

The operation of the clock signal buffer 72 will hereinafter be described with reference to FIG. 9.

The first current mode logic buffer CML1 may be enabled in response to the clock enable signal CKE to receive the clock signal CK and the inverted clock signal CKB to generate a buffered clock signal pair ckB and ck. For example, when the clock enable signal CKE is "high" in level, the tenth NMOS transistor N10 may be turned on, thereby causing the first current mode logic buffer CML1 to be enabled. In this state, when the clock signal CK is higher in level than the inverted clock signal CKB, the n/2 eighth NMOS transistors N81 to N8(n/2) may allow a larger amount of current to flow than the n/2 ninth NMOS transistors N91 to N9(n/2). As a result, the level of a third node n3 may become lower than that of a fourth node n4. In contrast, when the clock signal CK is lower in level than the inverted clock signal CKB, the n/2 eighth NMOS transistors N81 to N8(n/2) may allow a smaller amount of current to flow than the n/2 ninth NMOS transistors N91 to N9(n/2). As a result, the level of the third node n3 may become higher than that of the fourth node n4. The first current mode logic buffer CML1 may consume a current of I2/2 in operation.

The second current mode logic buffer CML2 may be enabled in response to the clock enable signal CKE to receive the buffered inverted clock signal ckB and the buffered clock signal ck to generate a buffered internal clock signal pair cki and ckiB, or the internal clock signal ICLK. The second current mode logic buffer CML2 may perform the same operation as that of the first current mode logic buffer CML1 described above to generate the buffered internal clock signal cki at a fifth node n5 and generate the buffered inverted internal clock signal ckiB at a sixth node n6. The second current mode logic buffer CML2 may consume a current of I2/2 in operation.

Figure 10:
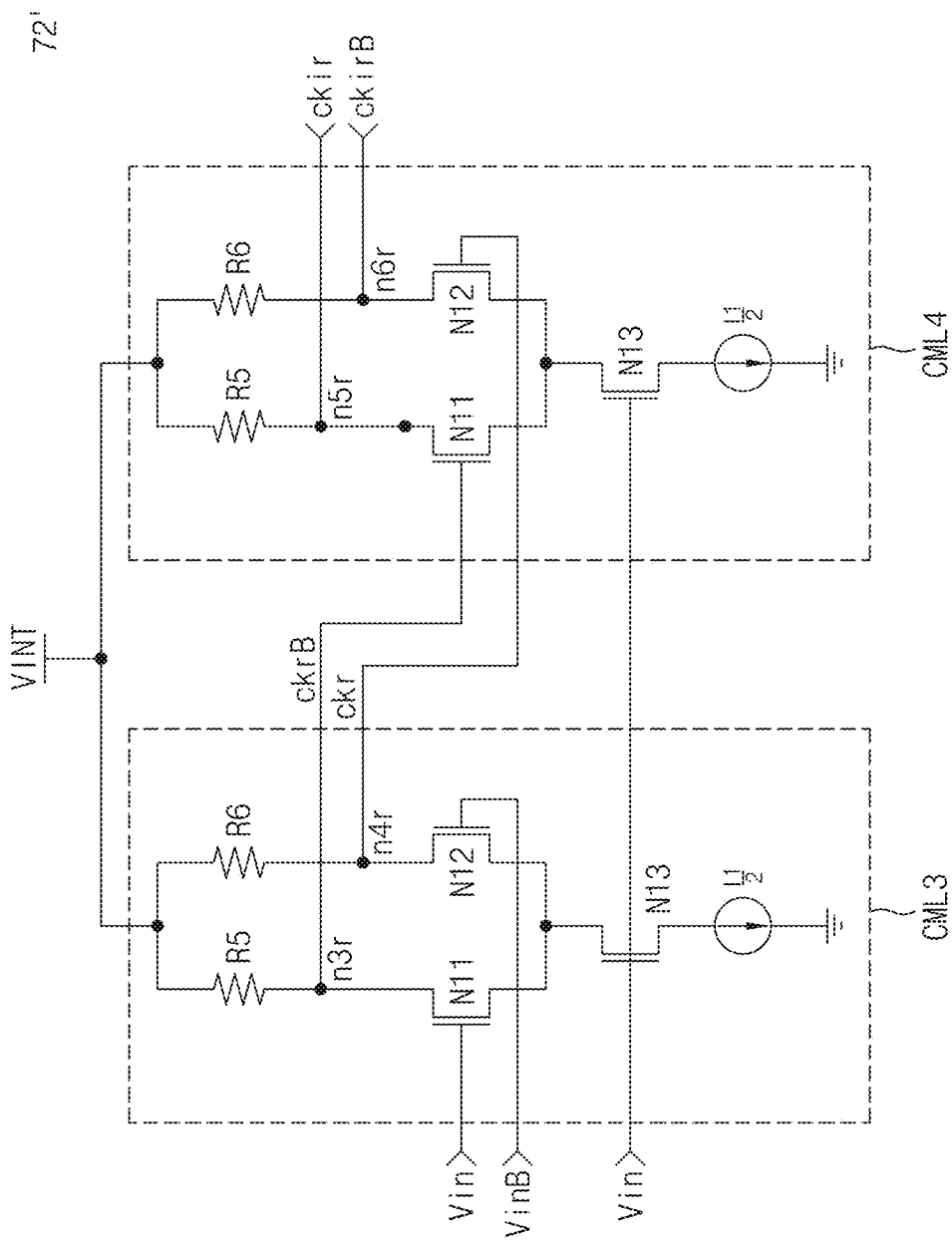
FIG. 10 is a circuit diagram of a clock signal buffer replica unit according to example embodiments of the disclosure.

FIG. 10 is a circuit diagram of a clock signal buffer replica unit according to example embodiments of the disclosure. A clock signal buffer replica unit 72' shown in FIG. 10 may be a current load replica unit configured to be smaller in size than the clock signal buffer 72 by replicating the clock signal buffer 72 shown in FIG. 9. The clock signal buffer replica unit 72' may include two, third and fourth current mode logic buffers CML3 and CML4 connected in cascade. Each of the third and fourth current mode logic buffers CML3 and CML4 may include fifth and sixth resistors R5 and R6, an eleventh NMOS transistor N11, a twelfth NMOS transistor N12, a thirteenth NMOS transistor N13, and a constant current source I1/2. The clock signal buffer replica unit 72' of FIG. 10 may be configured in such a manner that a differential voltage pair Vin and VinB are applied thereto. The voltage Vin may be a fixed voltage of a "high" level, and the inverted voltage VinB may be a fixed voltage of a "low" level.

The operation of the clock signal buffer replica unit 72' shown in FIG. 10 will hereinafter be described.

The third current mode logic buffer CML3 may always be enabled in response to the voltage Vin to receive the first voltage Vin and the second voltage VinB to generate a buffered replica clock signal pair ckrB and ckr. Because the first voltage Vin is higher than the second voltage VinB, the level of a third replica node n3r may be lower than that of a fourth replica node n4r. The third current mode logic buffer CML3 may consume current of I1/2 in operation.

The fourth current mode logic buffer CML4 may always be enabled in response to the voltage Vin to receive the buffered inverted replica clock signal ckrB and the buffered replica clock signal ckr to generate a buffered internal replica clock signal pair ckir and ckirB. That is, the fourth current mode logic buffer CML4 may perform the same operation as that of the third current mode logic buffer CML3 described above to make the level of a fifth replica node n5r higher than that of a sixth replica node n6r. The fourth current mode logic buffer CML4 may consume current of I1/2 in operation.

Although the voltage regulator 100, 100', 100" or 110 according to the above example embodiments has been applied to the semiconductor memory device 300 of FIG. 8 for illustrative purposes, it may be applied to various devices requiring a voltage regulator which receives the external supply voltage VEXT and generates the internal supply voltage VINT lower than the external supply voltage VEXT, as well as the semiconductor memory device 300 of FIG. 8.

As is apparent from the above description, according to example embodiments of the disclosure, even if a current load unit abruptly performs an operation, a voltage regulator may maintain an amplifier output voltage at a target level to stably generate an internal supply voltage. In addition, since the voltage regulator operates within a very small range of the amplifier output voltage, the bandwidth of an amplifier may not need to be wide.

Therefore, it may be possible to improve reliability of the operation of a semiconductor memory device having a voltage regulator according to example embodiments of the disclosure.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the disclosure has been particularly shown and described with reference to example embodiments thereof, it will be apparent to those skilled in the art that various changes in form and detail may be made without departing from the spirit and essential characteristics of the disclosure. The above example embodiments are therefore to be construed in all aspects as illustrative and not restrictive.

What is claimed is:

1. A voltage regulator comprising:
   an amplifier configured to amplify a difference between a reference voltage and a feedback voltage to generate an amplifier output voltage;
   a voltage feedback unit connected between an output supply voltage generation node, the output supply voltage generation node generating an output supply voltage, and a ground voltage and configured to generate the feedback voltage corresponding to the output supply voltage;
   a first transfer gate unit connected between an input supply voltage and the output supply voltage generation node and driven in response to the amplifier output voltage of a target level to provide a first current to the output supply voltage generation node;
   a current load replica unit connected between the output supply voltage generation node and the ground voltage and configured to be smaller in size than a current load unit to consume the first current; and a transfer unit connected between the input supply voltage and the output supply voltage generation node and driven in response to the amplifier output voltage of the target level when the current load unit performs an operation, to provide a second current larger than the first current to the output supply voltage generation node.

2. The voltage regulator according to claim 1, wherein:
the voltage feedback unit is a voltage divider, the voltage divider dividing the output supply voltage to generate the feedback voltage, and
the voltage regulator further comprises an output capacitor connected between the output supply voltage generation node and the ground voltage.

3. The voltage regulator according to claim 1, wherein:
the current load unit performs the operation in response to an enable signal to consume the second current, and
the transfer unit is turned on in response to the enable signal and provides the second current in response to the amplifier output voltage of the target level.

4. The voltage regulator according to claim 3, wherein the first current is smaller than the second current by a multiple.

5. The voltage regulator according to claim 4, wherein:
the current load replica unit is smaller in size than the current load unit by the multiple, and
the first transfer gate unit is smaller in size than the transfer unit by the multiple.

6. The voltage regulator according to claim 4, wherein the transfer unit comprises:
a second transfer gate unit connected to the input supply voltage and driven in response to the amplifier output voltage;
a first switching unit connected between the second transfer gate unit and the output supply voltage generation node and turned on in response to the enable signal;
a third transfer gate unit connected to the output supply voltage generation node and driven in response to the amplifier output voltage; and
a second switching unit connected between the input supply voltage and the third transfer gate unit and turned on in response to the enable signal,
wherein the second current/2 is provided to the output supply voltage generation node when the amplifier output voltage of the target level is applied to the second transfer gate unit and the first switching unit is turned on, and
wherein the second current/2 is provided to the output supply voltage generation node when the amplifier output voltage of the target level is applied to the third transfer gate unit and the second switching unit is turned on.

7. The voltage regulator according to claim 6, wherein:
if the multiple is n, the first transfer gate unit is a first PMOS transistor,
the second transfer gate unit comprises n/2 second PMOS transistors having sources connected to the input supply voltage and drains connected to n/2 first nodes,
the third transfer gate unit comprises n/2 third PMOS transistors having sources connected to n/2 second nodes and drains connected to the output supply voltage generation node,
the first switching unit comprises n/2 first switches connected between the drains of the n/2 second PMOS transistors and the output supply voltage generation node, and the second switching unit comprises n/2 second switches connected between the input supply voltage and the sources of the n/2 third PMOS transistors.

8. The voltage regulator according to claim 7, wherein the first PMOS transistor, each of the n/2 second PMOS transistors and each of the n/2 third PMOS transistors are the same in size.

9. The voltage regulator according to claim 7, further comprising:
a third switch connected between a drain of the first PMOS transistor and the output supply voltage generation node and turned off in response to the enable signal; and
a fourth switch connected between the output supply voltage generation node and the current load replica unit and turned off in response to the enable signal.

10. The voltage regulator according to claim 6, wherein:
if the multiple is n, the first transfer gate unit is a first NMOS transistor,
the second transfer gate unit comprises n/2 second NMOS transistors having drains connected to the input supply voltage and sources connected to n/2 first nodes,
the third transfer gate unit comprises n/2 third NMOS transistors having drains connected to n/2 second nodes and sources connected to the output supply voltage generation node,
the first switching unit comprises n/2 first switches connected between the sources of the n/2 second NMOS transistors and the output supply voltage generation node, and
the second switching unit comprises n/2 second switches connected between the input supply voltage and the drains of the n/2 third NMOS transistors.

11. The voltage regulator according to claim 10, wherein the first NMOS transistor, each of the n/2 second NMOS transistors and each of the n/2 third NMOS transistors are the same in size.

12. The voltage regulator according to claim 10, further comprising:
a third switch connected between a source of the first NMOS transistor and the output supply voltage generation node and turned off in response to the enable signal; and
a fourth switch connected between the output supply voltage generation node and the current load replica unit and turned off in response to the enable signal.

13. A voltage regulator comprising:
an amplifier configured to amplify a difference between a reference voltage and a feedback voltage to generate an amplifier output voltage;
a voltage divider connected between an output supply voltage generation node, the output supply voltage generation node generating an output supply voltage, and a ground voltage and configured to divide the output supply voltage to generate the feedback voltage;
a first transfer gate unit connected between an input supply voltage and the output supply voltage generation node and driven in response to the amplifier output voltage of a target level to provide first current to the output supply voltage generation node;
a current load replica unit connected between the output supply voltage generation node and the ground voltage and configured to be smaller in size than a current load unit to consume the first current;
a transfer unit connected between the input supply voltage and the output supply voltage generation node, and, when the current load unit performs an operation in response to an enable signal, turned on in response to the enable signal and driven in response to the amplifier output voltage of the target level to provide second current larger than the first current to the output supply voltage generation node; and an output capacitor connected between the output supply voltage generation node and the ground voltage.

14. The voltage regulator according to claim 13, wherein the first current is smaller than the second current by a multiple.

15. The voltage regulator according to claim 14, wherein:
the current load replica unit is smaller in size than the current load unit by the multiple, and
the first transfer gate unit is smaller in size than the transfer unit by the multiple.

16. The voltage regulator according to claim 15, wherein the transfer unit comprises:
a second transfer gate unit connected to the input supply voltage and driven in response to the amplifier output voltage;
a first switching unit connected between the second transfer gate unit and the output supply voltage generation node and turned on in response to the enable signal;
a third transfer gate unit connected to the output supply voltage generation node and driven in response to the amplifier output voltage; and
a second switching unit connected between the input supply voltage and the third transfer gate unit and turned on in response to the enable signal,
wherein second current/2 is provided to the output supply voltage generation node when the amplifier output voltage of the target level is applied to the second transfer gate unit and the first switching unit is turned on, and
wherein second current/2 is provided to the output supply voltage generation node when the amplifier output voltage of the target level is applied to the third transfer gate unit and the second switching unit is turned on.

17. The voltage regulator according to claim 16, wherein:
if the multiple is n, the first transfer gate unit is a first PMOS transistor,
the second transfer gate unit comprises n/2 second PMOS transistors having sources connected to the input supply voltage and drains connected to n/2 first nodes,
the third transfer gate unit comprises n/2 third PMOS transistors having sources connected to n/2 second nodes and drains connected to the output supply voltage generation node,
the first switching unit comprises n/2 first switches connected between the drains of the n/2 second PMOS transistors and the output supply voltage generation node, and
the second switching unit comprises n/2 second switches connected between the input supply voltage and the sources of the n/2 third PMOS transistors.

18. The voltage regulator according to claim 17, wherein the first PMOS transistor, each of the n/2 second PMOS transistors and each of the n/2 third PMOS transistors are the same in size.

19. The voltage regulator according to claim 17, further comprising:
a third switch connected between a drain of the first PMOS transistor and the output supply voltage generation node and turned off in response to the enable signal; and
a fourth switch connected between the output supply voltage generation node and the current load replica unit and turned off in response to the enable signal.

20. A semiconductor memory device comprising:
a voltage regulator configured to receive an external supply voltage and generate an internal supply voltage lower than the external supply voltage to an internal supply voltage generation node;
a clock signal buffer connected to the internal supply voltage generation node to receive the internal supply voltage and enabled in response to a clock enable signal to buffer an external clock signal to generate an internal clock signal;
a command and address generator configured to decode a command and address in response to the external clock signal and the clock enable signal to generate an active command, a read command and a write command, and generate an address signal included in the command and address as a row address in response to the active command and as a column address in response to the read command or write command;
a row decoder configured to decode the row address to generate a plurality of word line select signals;
a column decoder configured to decode the column address to generate a plurality of column select signals; and
a memory cell array comprising a plurality of memory cells connected between a plurality of word lines selected by the plurality of word line select signals and a plurality of bit lines selected by the plurality of column select signals,
wherein the voltage regulator comprises:
an amplifier configured to amplify a difference between a reference voltage and a feedback voltage to generate an amplifier output voltage;
a voltage feedback unit connected between the internal supply voltage generation node and a ground voltage and configured to generate the feedback voltage corresponding to the internal supply voltage;
a first transfer gate unit connected between the external supply voltage and the internal supply voltage generation node and driven in response to the amplifier output voltage of a target level to provide first current;
a clock signal buffer replica unit connected between the internal supply voltage generation node and the ground voltage and configured to be smaller in size than the clock signal buffer to consume the first current; and
a transfer unit connected between the external supply voltage and the internal supply voltage generation node and driven in response to the amplifier output voltage of the target level when the clock signal buffer performs an operation in response to the clock enable signal, to provide second current larger than the first current.

21. The semiconductor memory device according to claim 20, wherein:
the voltage feedback unit is a voltage divider, the voltage divider dividing the internal supply voltage to generate the feedback voltage, and
the voltage regulator further comprises an output capacitor connected between the internal supply voltage generation node and the ground voltage.

22. The semiconductor memory device according to claim 21, wherein:
the clock signal buffer consumes the second current when performing the operation in response to the clock enable signal, and the transfer unit is turned on in response to the clock enable signal and provides the second current in response to the amplifier output voltage of the target level.

23. The semiconductor memory device according to claim 22, wherein the first current is smaller than the second current by a multiple.

24. The semiconductor memory device according to claim 23, wherein:
the clock signal buffer replica unit is smaller in size than the clock signal buffer by n times, and
the first transfer gate unit is smaller in size than the transfer unit by n times.

25. The semiconductor memory device according to claim 23, wherein the transfer unit comprises:
a second transfer gate unit connected to the external supply voltage and driven in response to the amplifier output voltage;
a first switching unit connected between the second transfer gate unit and the internal supply voltage generation node and turned on in response to the clock enable signal;
a third transfer gate unit connected to the internal supply voltage generation node and driven in response to the amplifier output voltage; and
a second switching unit connected between the external supply voltage and the third transfer gate unit and turned on in response to the clock enable signal,
wherein second current/2 is provided to the internal supply voltage generation node when the amplifier output voltage of the target level is applied to the second transfer gate unit and the first switching unit is turned on, and
wherein second current/2 is provided to the internal supply voltage generation node when the amplifier output voltage of the target level is applied to the third transfer gate unit and the second switching unit is turned on.

26. The semiconductor memory device according to claim 25, wherein:
if the multiple is n, the first transfer gate unit is a first PMOS transistor,
the second transfer gate unit comprises n/2 second PMOS transistors having sources connected to the external supply voltage and drains connected to n/2 first nodes,
the third transfer gate unit comprises n/2 third PMOS transistors having sources connected to n/2 second nodes and drains connected to the internal supply voltage generation node,
the first switching unit comprises n/2 first switches connected between the drains of the n/2 second PMOS transistors and the internal supply voltage generation node, and
the second switching unit comprises n/2 second switches connected between the external supply voltage and the sources of the n/2 third PMOS transistors.

27. The semiconductor memory device according to claim 26, wherein the first PMOS transistor, each of the n/2 second PMOS transistors and each of the n/2 third PMOS transistors are the same in size.

28. The semiconductor memory device according to claim 26, wherein the voltage regulator further comprises:
a third switch connected between a drain of the first PMOS transistor and the internal supply voltage generation node and turned off in response to the clock enable signal; and
a fourth switch connected between the internal supply voltage generation node and the clock signal buffer replica unit and turned off in response to the clock enable signal.

* * * * *